United States Patent
Kapoor

Patent Number: 5,985,746
Date of Patent: Nov. 16, 1999

[54] PROCESS FOR FORMING SELF-ALIGNED CONDUCTIVE PLUGS IN MULTIPLE INSULATION LEVELS IN INTEGRATED CIRCUIT STRUCTURES AND RESULTING PRODUCT

[75] Inventor: Ashok K. Kapoor, Palo Alto, Calif.

[73] Assignee: LSI Logic Corporation, Milpitas, Calif.

[21] Appl. No.: 08/754,696

[22] Filed: Nov. 21, 1996

[51] Int. Cl.$^6$ .............................................. H01L 21/4763
[52] U.S. Cl. ........................ 438/622; 438/624; 438/631; 438/634; 438/637; 438/638; 438/666; 438/668; 438/671; 438/672
[58] Field of Search ................................... 438/622, 624, 438/631, 634, 637, 638, 666, 668, 671, 672

[56] References Cited

U.S. PATENT DOCUMENTS

| | | | |
|---|---|---|---|
| 4,789,648 | 12/1988 | Chow et al. | 438/637 |
| 4,966,868 | 10/1990 | Murali et al. | 437/193 |
| 5,204,286 | 4/1993 | Doan | 437/195 |
| 5,244,534 | 9/1993 | Yu et al. | 156/636 |
| 5,252,517 | 10/1993 | Blalock et al. | 437/195 |
| 5,288,665 | 2/1994 | Nulman | 437/194 |
| 5,356,836 | 10/1994 | Chen et al. | 437/194 |
| 5,423,939 | 6/1995 | Bryant et al. | 216/18 |
| 5,451,543 | 9/1995 | Woo et al. | 437/195 |
| 5,466,640 | 11/1995 | Choi | 438/637 |
| 5,490,901 | 2/1996 | Kim | 438/638 |
| 5,578,523 | 11/1996 | Fiordalice et al. | 438/622 |
| 5,726,098 | 3/1998 | Tsuboi | 438/622 |
| 5,792,704 | 8/1998 | Jun et al. | 438/624 |

Primary Examiner—John F. Niebling
Assistant Examiner—Lynne A. Gurley
Attorney, Agent, or Firm—John P. Taylor

[57] ABSTRACT

A process and resulting product are disclosed for an integrated circuit structure including two or more metal wiring levels interconnected by metal-filled vias. A first insulation layer, such as an oxide layer, is formed over a first metal wiring level on an integrated circuit structure. A via mask layer, such as a nitride mask layer, is then formed over the insulation layer with openings formed in the via mask layer in registry with portions of the underlying metal wiring to which it is desired to make electrical contact by the formation of vias through the first insulation layer. A second insulation layer, which may comprise a second oxide layer, is then formed over the mask layer. A reverse second metal wiring level mask, such as a photoresist mask or another nitride mask, is then formed over the second insulation layer to define the second metal wiring. The second insulation layer is then anisotropically etched with an etchant which is selective to the second level metal wiring mask and the via mask, i.e., it will etch both of the insulation layers in preference to the mask materials. The etching of the upper insulation layer forms openings, e.g., trenches, therein conforming to the desired metal pattern of the second metal wiring level, stopping at the via etch mask. However, wherever openings occur in the via etch mask, the etch continues through such openings and through the underlying first insulation layer to form vias extending down to the first level of metal wiring thereunder. The second metal wiring level mask is then removed and a metal layer is deposited over the second insulation level and into the openings, e.g., trenches, etched therein corresponding to the desired second level metal wiring. At the same time the metal deposits in the vias down to the first metal wiring (which is usually formed at a higher temperature by choosing different melting point alloys). Any metal deposited on the surface of the second insulation layer is then removed, leaving the second level metal wiring deposited in the openings (trenches) formed in the second insulation layer, and the metal deposited in the vias forming metal plugs which serve to electrically interconnect the first and second metal wiring levels.

13 Claims, 14 Drawing Sheets

PROCESS FOR FORMING SELF-ALIGNED CONDUCTIVE PLUGS IN MULTIPLE INSULATION LEVELS IN INTEGRATED CIRCUIT STRUCTURES AND RESULTING PRODUCT

BACKGROUND OF THE INVENTION

1. Field of the Invention

This invention relates to interconnecting multiple metal wiring levels of integrated circuit structures by the formation of conductive plugs through a plurality of insulation layers. More particularly, this invention relates to the formation of openings through multiple layers of insulation to electrically connect portions of one metal wiring layer with portions of another metal wiring layer using a via etch mask located between the insulation layers.

2. Description of the Related Art

The forming of electrical connections between metal wiring on one level in an integrated circuit structure with metal wiring on a different level is usually accomplished by forming a vertical opening known as a via through one or more layers of insulation which separate the two levels of metal wiring.

This is normally carried out by forming one or more insulation layers over the first metal wiring level, masking the one or more insulation layers with a via etch mask, and then selectively etching the layer or insulation layers through openings in the via etch mask down to the underlying metal wiring to form the vias. The vias are then filled with metal, either in an independent step or during the deposition of a further metal layer, followed by patterning of the deposited metal layer, using a reverse metal wiring mask (a mask with solid portions corresponding to the desired metal wiring), to form the second metal wiring level.

There are several problems with this conventional method of forming vias and using these vias to electrically connect multiple metal wiring levels. The vias are not self-aligned and some overlap of the metal above and below the via is needed. Furthermore, separate etch masks and etch steps are required to respectively form the vias (by etching the underlying insulation layer through a via etch mask) and to later pattern the subsequently deposited metal layer. Also, when the via is filled the same metal which later will be patterned, only one layer can be filled by flowing the metal into the via, since heating the additional layers would melt the metal underneath and deform the metal lines. Furthermore, when a generic gate array structure is initially formed which will later have either contact openings formed to the substrate or vias formed down to a lower metal wiring layer, additional masks and processing steps are involved when the vias must be later formed as a part of a custom wiring structure to only contact selected underlying devices, e.g., certain MOS transistors in the underlying gate array of MOS transistors.

SUMMARY OF THE INVENTION

In accordance with the invention, a first insulation layer such as an oxide layer is formed over a first metal wiring level on an integrated circuit structure. A via etch mask layer, such as a nitride mask layer, is then formed over the insulation layer with openings formed in the via etch mask layer over portions of the underlying metal wiring to which it is desired to make electrical contact by the formation of a via through the first insulation layer. A second insulation layer, which may comprise a second oxide layer, is then formed over the via etch mask. A reverse second metal wiring level mask, such as a photoresist mask or another nitride mask, is then formed over the second insulation layer to define a second metal wiring layer which will have portions preferably orthogonal to the openings in the underlying via etch mask. The second insulation layer is then etched with an etchant which is selective to the second level metal wiring mask and the via etch mask, i.e., it will etch both of the insulation layers in preference to either of the mask materials. The etching of the upper insulation layer forms openings, e.g., trenches, therein conforming to the desired metal pattern of the second metal wiring level, stopping at the via etch mask. However, wherever openings are encountered in the via etch mask, the etch continues through such openings and through the underlying first insulation layer to thereby form a via down to the first level of metal wiring thereunder. The second metal wiring level mask is then removed and a metal layer is deposited over the second insulation level and into the openings, e.g., trenches, etched therein corresponding to the desired second level metal wiring. At the same time the metal deposits in the vias down to the first metal wiring (which is usually formed at a higher temperature by choosing different melting point alloys). Metal deposited on the surface of the second insulation layer is then removed, leaving the second level metal wiring deposited in the openings (trenches) formed in the second insulation layer, and the metal simultaneously deposited in the vias forming metal plugs which serve to electrically interconnect the first and second metal wiring levels.

DETAILED DESCRIPTION OF THE INVENTION

Figure 1:
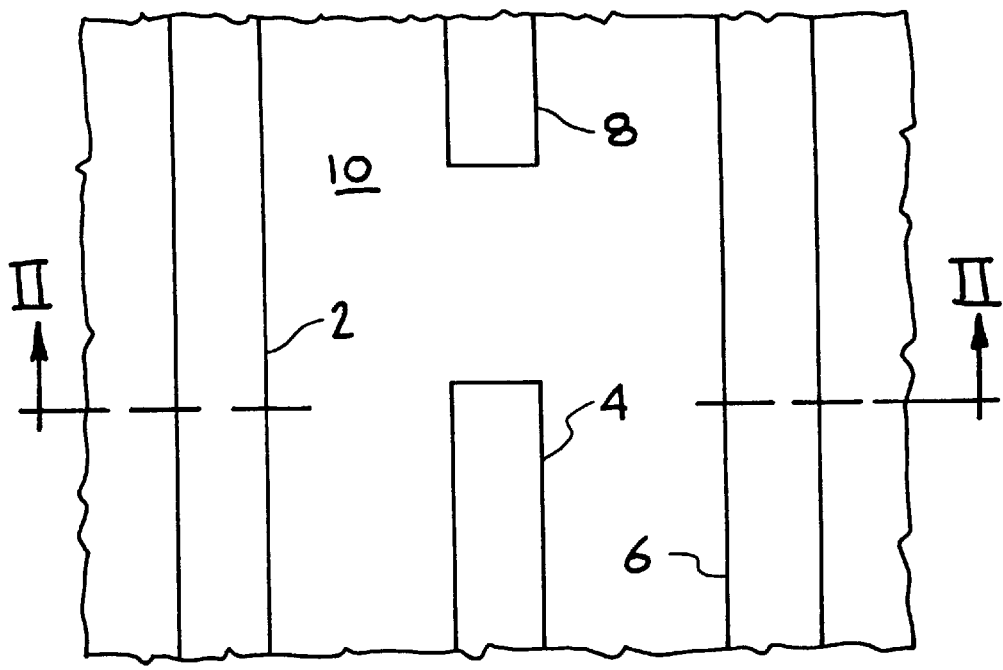
FIG. 1 is a fragmentary top view of a first metal wiring level formed over an integrated circuit structure to selectively electrically interconnect various portions of the underlying integrated circuit structure.
Figure 2:
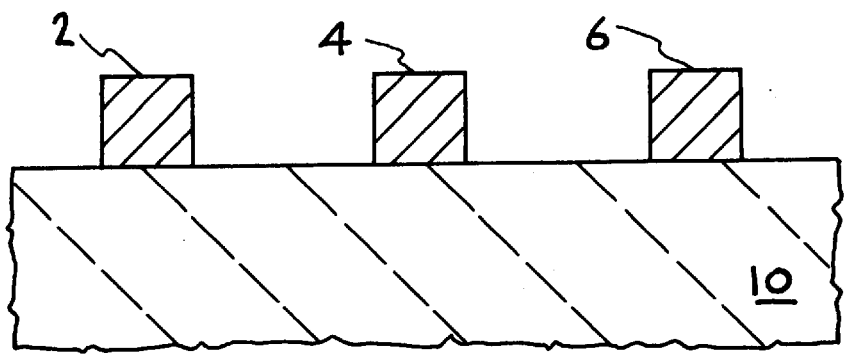
FIG. 2 is a fragmentary vertical side-section view of the structure of FIG. 1 taken along lines II—II showing the raised lines comprising the first metal wiring level.

Turning now to FIGS. 1 and 2, metal lines 2, 4, 6, and 8, representing a first metal wiring level, are shown formed over an integrated circuit structure 10. Typically, such metal lines may have a thickness or height ranging from about 0.2 micrometer ($\mu$m) to about 2 $\mu$m. Of course it will be appreciated that at least a portion of integrated circuit structure 10 beneath the first metal wiring level will comprise insulation material through which contact openings are formed (and filled with electrically conductive material) to electrically interconnect active components of the integrated circuit structure with the first metal wiring level.

Figure 3:
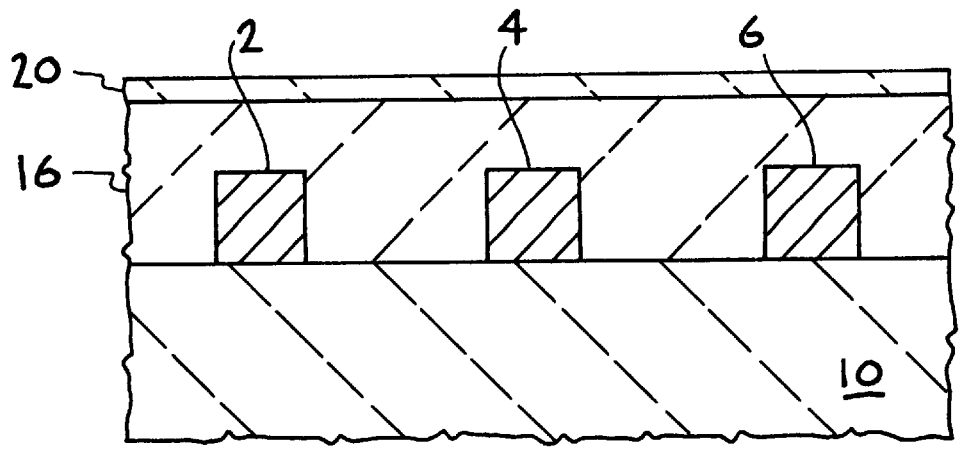
FIG. 3 is a fragmentary vertical side-section view of the structure shown in FIG. 2 after deposition and planarization of a first insulation layer over the metal wiring and the formation of a via mask layer over the first insulation layer.

A first insulation layer 16 is formed over metal lines 2, 4, 6, and 8, as shown in FIG. 3. The thickness of insulation layer 16 over metal lines 2–8 preferably ranges from about 0.1 $\mu$m to about 1 $\mu$m. In this embodiment, insulation layer 16 is planarized to provide a flat upper surface thereon. Insulation layer 16 preferably comprises a silicon oxide layer, and most preferably (for purposes of planarization) a low melting point doped silicon oxide glass such as, for example, a borosilicate glass (BSG) or a borophosphosilicate glass (BPSG). Insulation layer 16 may also comprise a composite layer such as an undoped $SiO_2$ layer, with a doped $SiO_2$ layer, e.g., a borophosphosilicate layer, formed over the undoped $SiO_2$ layer.

Still referring to FIG. 3, a via mask layer 20, preferably ranging in thickness from about 0.05 $\mu$m to about 0.5 $\mu$m, is shown formed over insulation layer 16, in accordance with the invention. Via mask layer 20 will comprise a material different than insulation material 16 so that insulation material 16 may be subsequently etched through the openings in via mask layer 20. Preferably, via mask layer 20 will comprise a material compatible with other materials commonly used in integrated circuit structure construction, such as a nitride-based material, e.g., silicon nitride or silicon oxynitride. Undoped amorphous silicon may also be used for this purpose.

Figure 4:
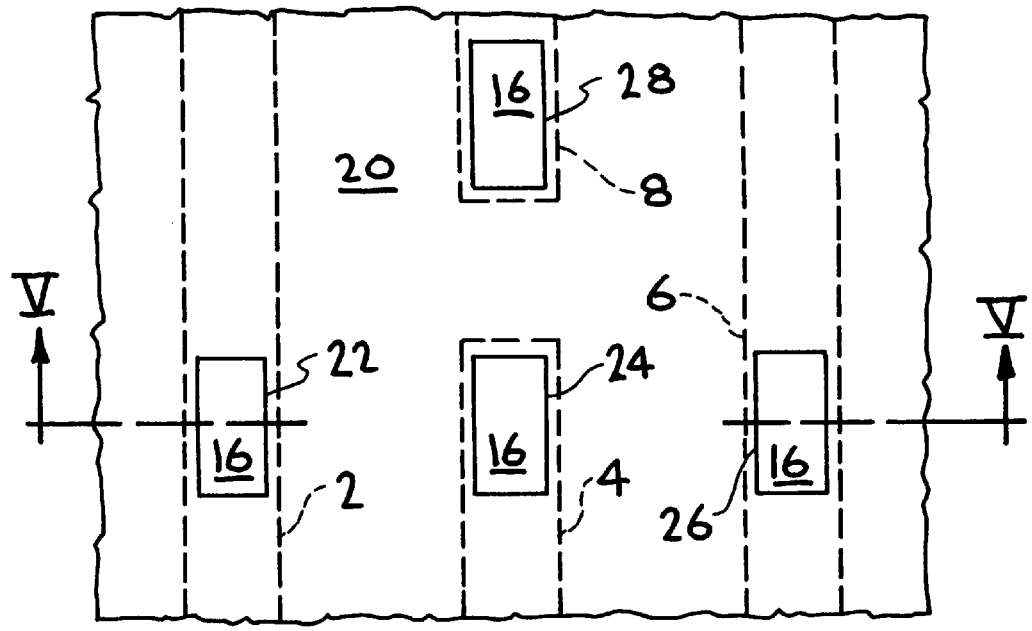
FIG. 4 is a fragmentary top view of the structure of FIG. 3 after the via mask layer has been patterned to form rectangular via openings aligned with the underlying first metal wiring.
Figure 5:
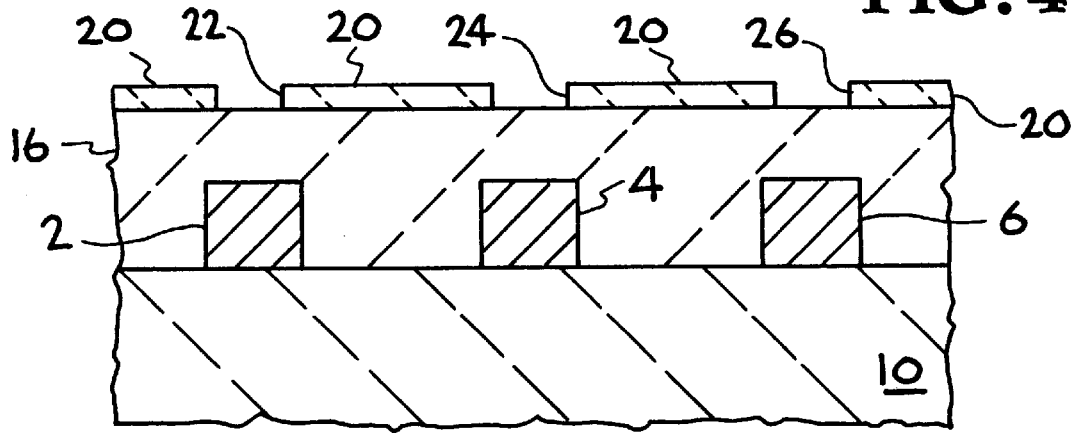
FIG. 5 is a fragmentary side section view of the FIG. 4 structure, taken along lines V—V.

Referring to FIGS. 4 and 5, via etch mask 20 is provided with rectangular mask openings 22, 24, 26, and 28 formed with the long axis of each rectangular opening shown in general registry with the long axis of underlying metal lines 2, 4, 6, and 8 (shown in dotted lines), to permit vias to be eventually etched through first insulation layer 16 down to metal lines 2, 4, 6, and 8. Most preferably, the widths of rectangular via mask openings 22, 24, 26, and 28 are dimensionally formed slightly smaller, e.g., from about 0.01 $\mu$m to about 0.2 $\mu$m smaller, than the width dimension of metal lines 2, 4, 6, and 8 to further assist in maintaining registry of the vias to be etched in first insulation layer 16 with the respective underlying metal lines.

Figure 6:
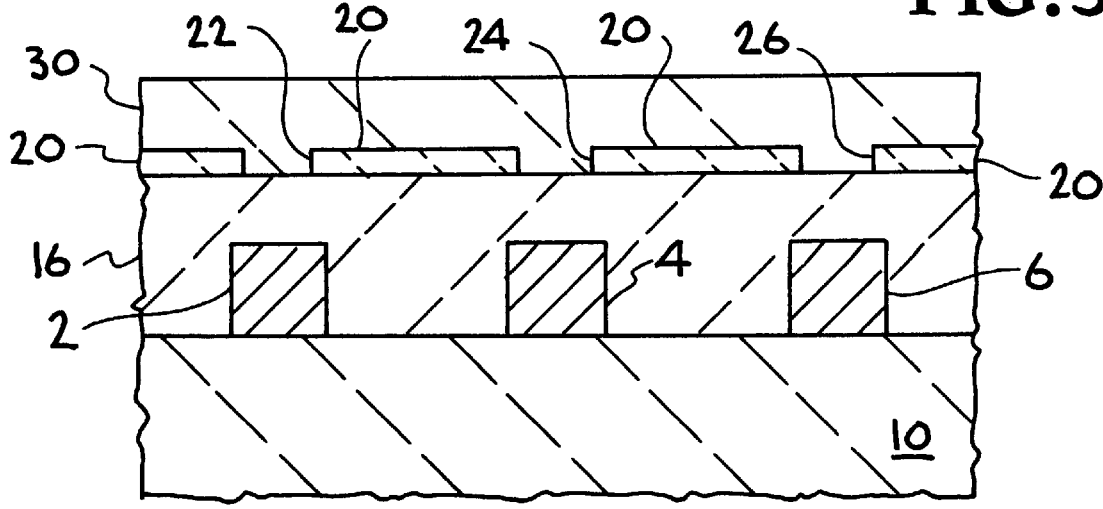
FIG. 6 is a fragmentary vertical side-section view of the structure of FIGS. 4 and 5 after formation of a second insulation layer over the patterned via mask layer.
Figure 7:
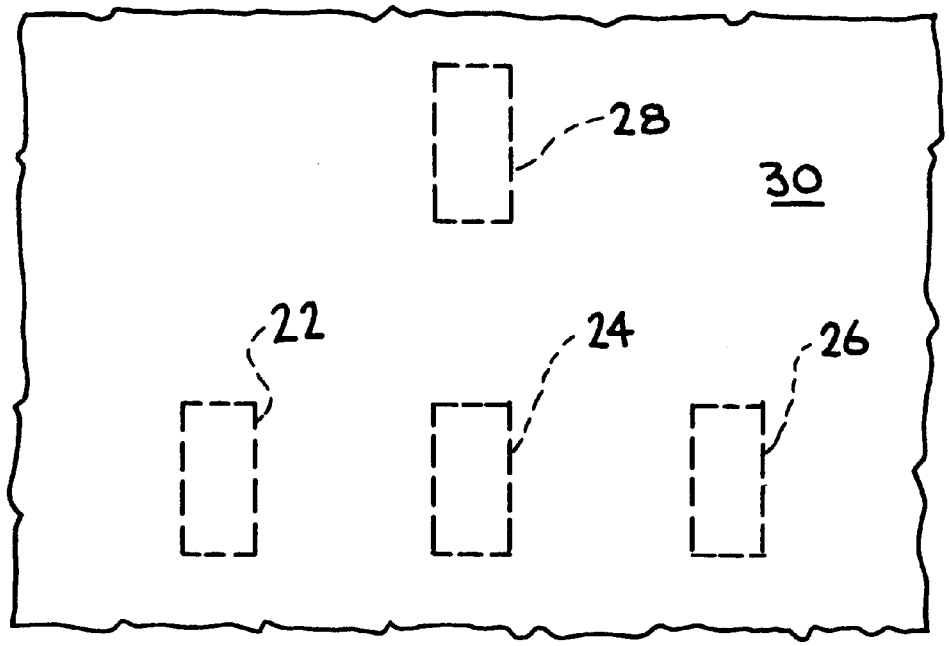
FIG. 7 is a top view of the structure of FIG. 6, showing, in dotted lines, the underlying rectangular openings in the via mask beneath the second insulation layer.

A second insulation layer 30 is then formed over the structure of FIGS. 4 and 5, as shown in FIGS. 6 and 7. Preferably, second insulation layer 30 has a thickness approximately equal to that of the thickness of metal lines 2–8, i.e., ranging from about 0.2 $\mu$m to about 2 $\mu$m, and comprises either the same insulation material as first insulation layer 16, or at least comprises an insulation material which can be etched concurrently with first insulation layer 16. That is, in accordance with the invention, first insulation layer 16 and second insulation layer 30 should be responsive to the same etch system.

Figure 8:
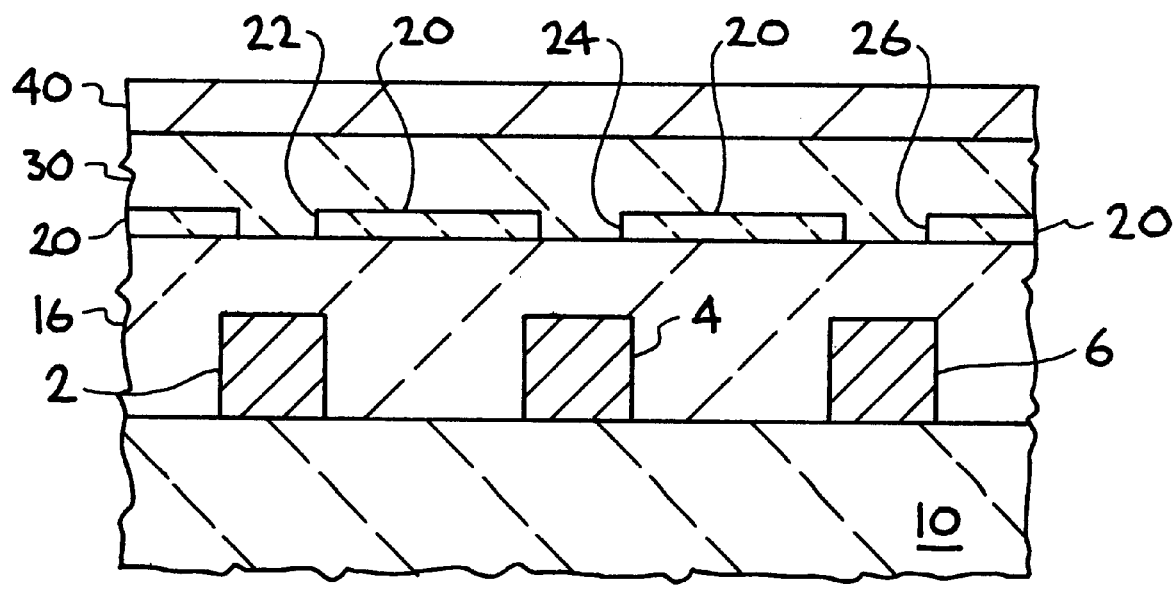
FIG. 8 is a fragmentary vertical side-section view of the structure of FIG. 6 showing formation of a mask layer formed over the second insulation layer, but prior to patterning of the mask layer.
Figure 9:
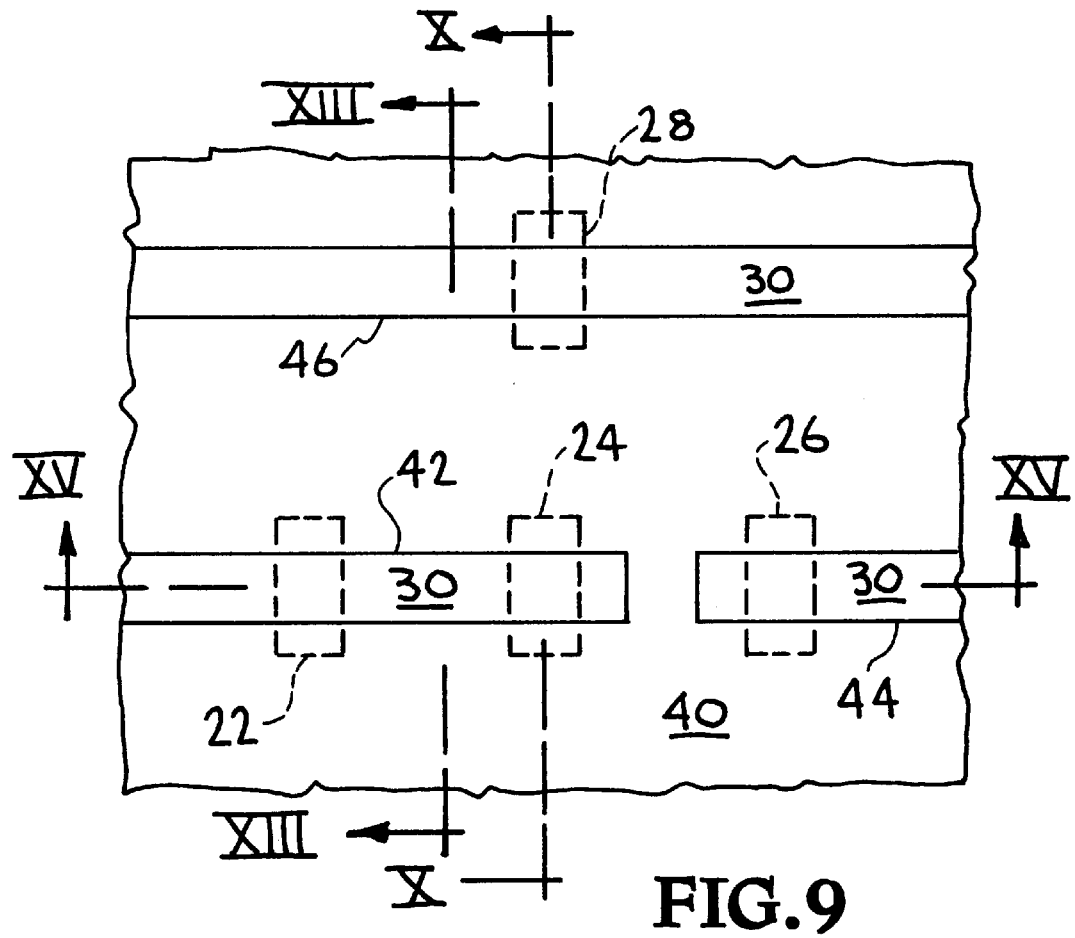
FIG. 9 is top view of the structure of FIG. 8, shown after the patterning of the reverse second metal wiring mask, and showing, in dotted lines, the rectangular via openings in the underlying via mask aligned to the openings in the reverse metal mask.

Second insulation layer 30 is then planarized, if needed, and a reverse second metal wiring level mask 40 is formed over second insulation layer 30, as shown in FIGS. 8 and 9. Reverse second wiring level mask 40 has openings therein 42, 44, and 46, which are preferably rectangular, as best seen in FIG. 9, for the formation of trenches in second insulation layer 30 in which metal lines comprising the second wiring level will be formed, as will be discussed below.

Figure 10:
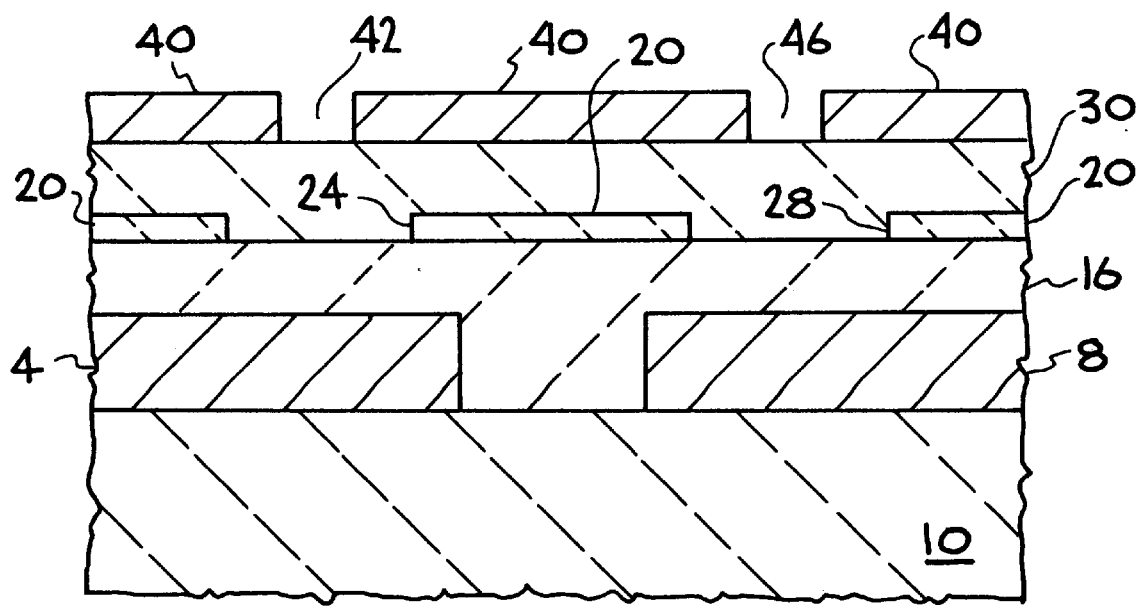
FIG. 10 is a fragmentary vertical side-section view of the structure of FIG. 9 taken along lines X—X, showing the patterned second metal wiring etch mask, and the underlying via etch mask, prior to etching of the underlying insulation layers through the respective masks.

It will be noted that in FIGS. 9 and 10, the illustrated rectangular openings 42, 44, and 46 in second metal level wiring mask 40 are in respective registry (aligned) with, but disposed orthogonally, to underlying rectangular openings 22, 24, 26, and 28 in underlying via mask layer 20 so that subsequent etching of second insulation layer 30 through openings 42–46 in second metal level etch mask 40 will expose portions of openings 22–28 in via etch mask 20 to permit the etching of underlying portions of first insulation layer 16 to form vias extending down to metal lines 2–8, as will be described below. It should be noted that rectangular openings 42–46 in reverse second wiring level mask 40 need not be in exact registry with openings 22–28 in underlying via etch mask 20 to provide the formation of the self-aligned vias down to first wiring level metal lines 2–8. However, depending upon the structure, it may be desirable to control the depth of the etch through openings 22–28 to be described below.

Figure 11:
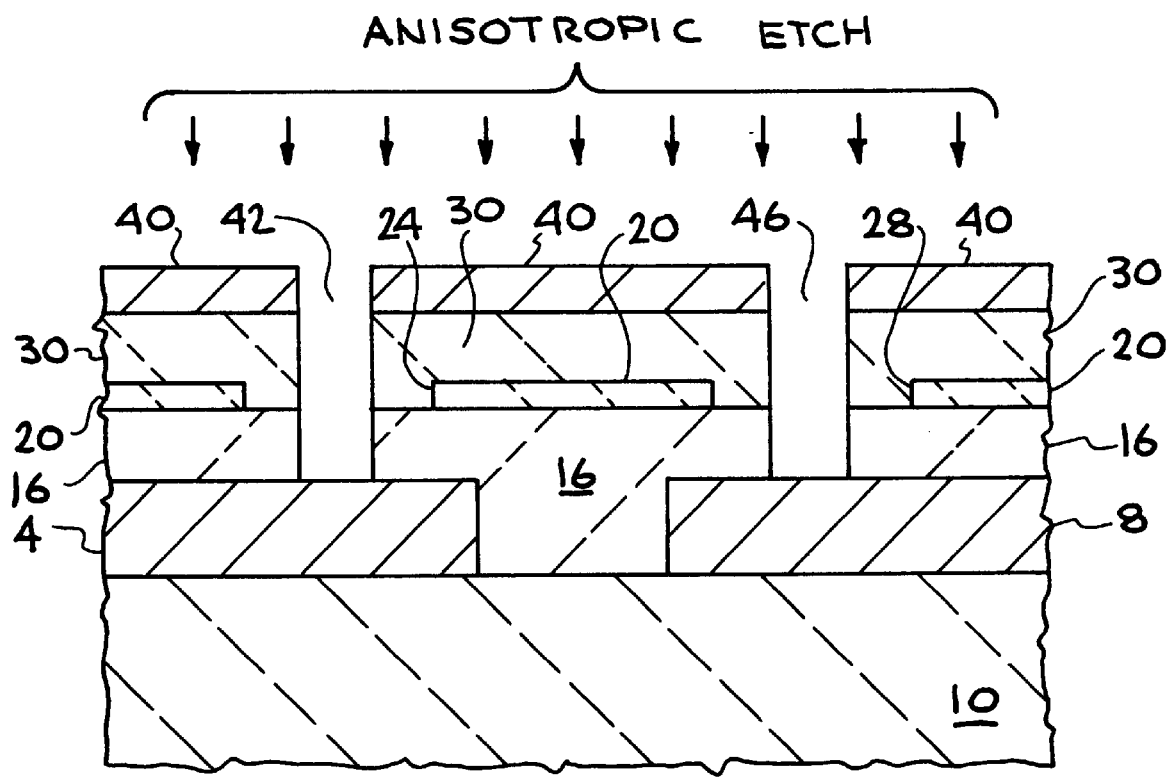
FIG. 11 is a fragmentary side-section view of the structure of FIG. 10 after etching the upper insulation layer through the second metal wiring level mask to form trenches therein conforming to the desired pattern of the second metal wiring layer, and etching through the via etch mask and the lower insulation layer to form vias down to the first metal wiring level.
Figure 13:
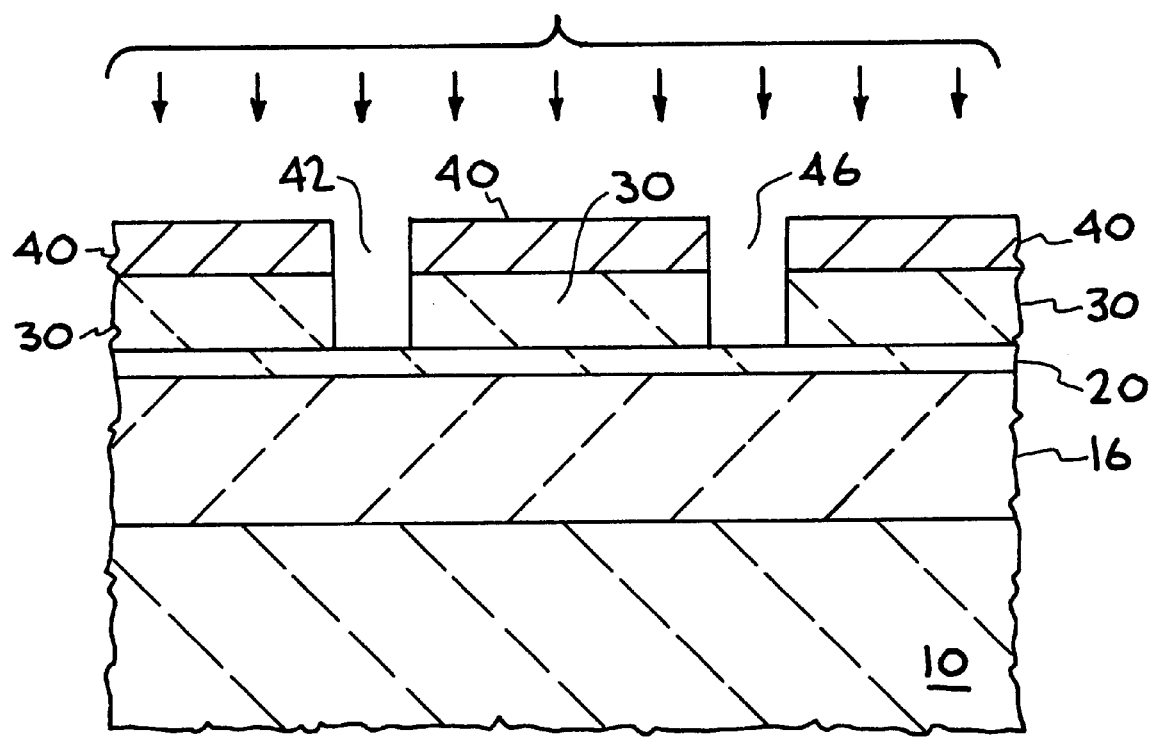
FIG. 13 is a fragmentary vertical side-section view of the structure of FIG. 9 taken along lines XIII—XIII, showing the patterned metal wiring etch mask and a solid portion of the underlying via etch mask after etching of the upper insulation layer through the patterned metal wiring etch mask down to the via etch mask.
Figure 15:
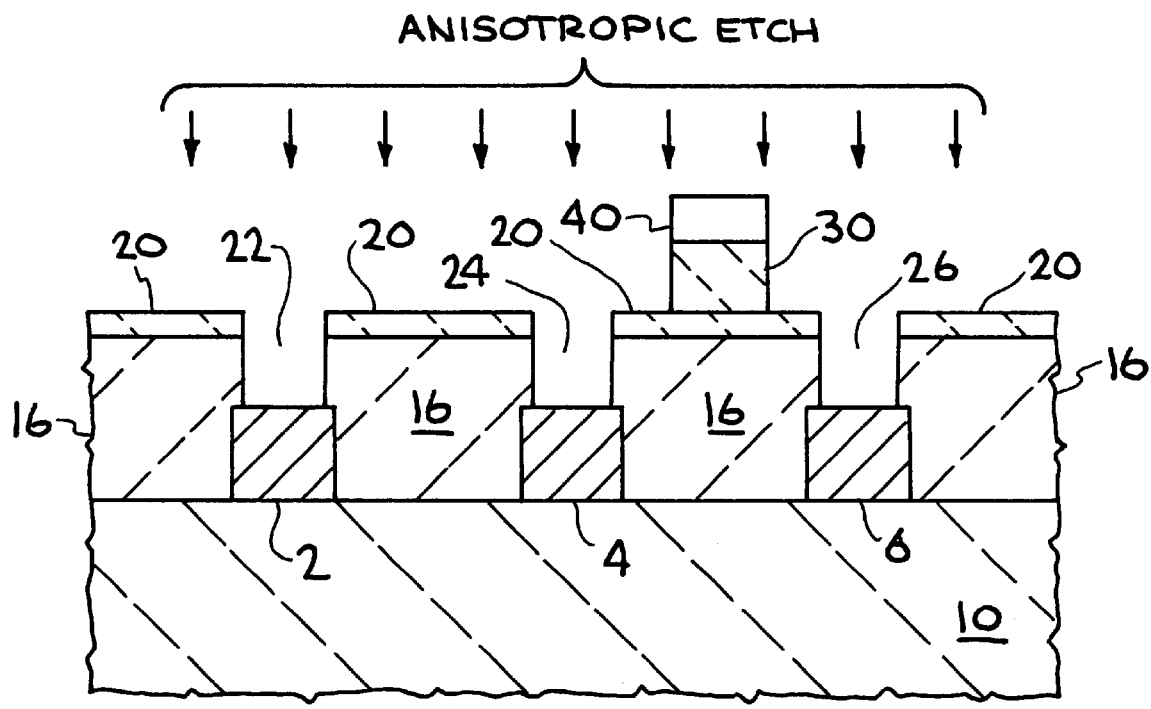
FIG. 15 is a fragmentary vertical side-section view of the structure of FIG. 9 taken along lines XV—XV, showing the patterned metal wiring etch mask and a solid portion of the underlying via etch mask after etching of the upper insulation layer through the patterned metal wiring etch mask down to the via etch mask.

After formation of reverse second metal wiring level mask 40 over second insulation layer 30, exposed portions of second insulation layer 30 (and those portions of first insulation layer 16 exposed through openings 22, 24, 26, and 28 in via mask 20) are anisotropically etched through openings 42, 44, and 46 in second metal wiring mask 40, as shown in FIGS. 11, 13, and 15. As previously discussed, in accordance with the invention first insulation layer 16 and second insulation layer 30 are preferably formed of the same materials, e.g., silicon oxide, but are at least formed from materials which will etch at the same rate in an etching system so that the trenches 32, 34, and 36 may be etched in insulation layer 30 down to via etch mask 20 in the same etch step as the etching of first layer 16 through openings 22, 24, 26, and 28, respectively, in via etch mask 20 to form vias extending down to the underlying metal lines 2–8. Preferably, the via etch depth of openings 22, 24, 26, and 28 is controlled so that the bottom of the via is either equal to or slightly in excess of the thickness of insulating layer 30 over metal lines 2–8 to ensure that in case of misalignment, the via depth will not extend down to the underlying integrated circuit structure. That is, the depth of vias 22–28 should preferably be less than the sum of the thickness of insulating layer 30 over metal lines 2–8 plus the thickness of the particular metal line.

Figure 12:
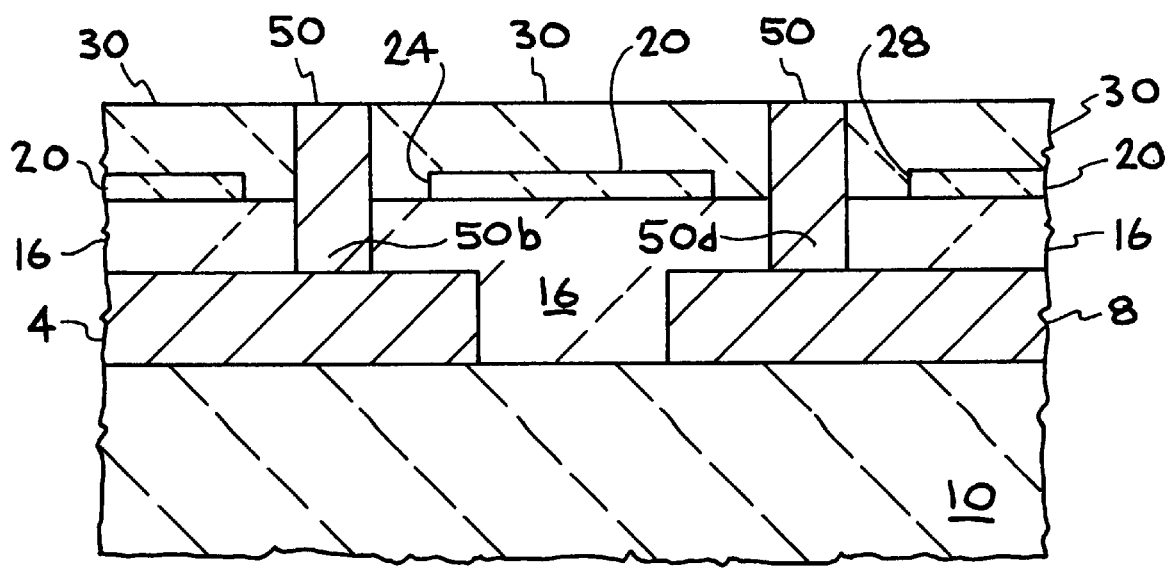
FIG. 12 is a fragmentary vertical side-section view of the final structure of FIG. 11 showing the trenches filled with metal to form the second metal wiring level and the filling of the vias with metal to electrically connect the first metal wiring level with the second metal wiring level.
Figure 14:
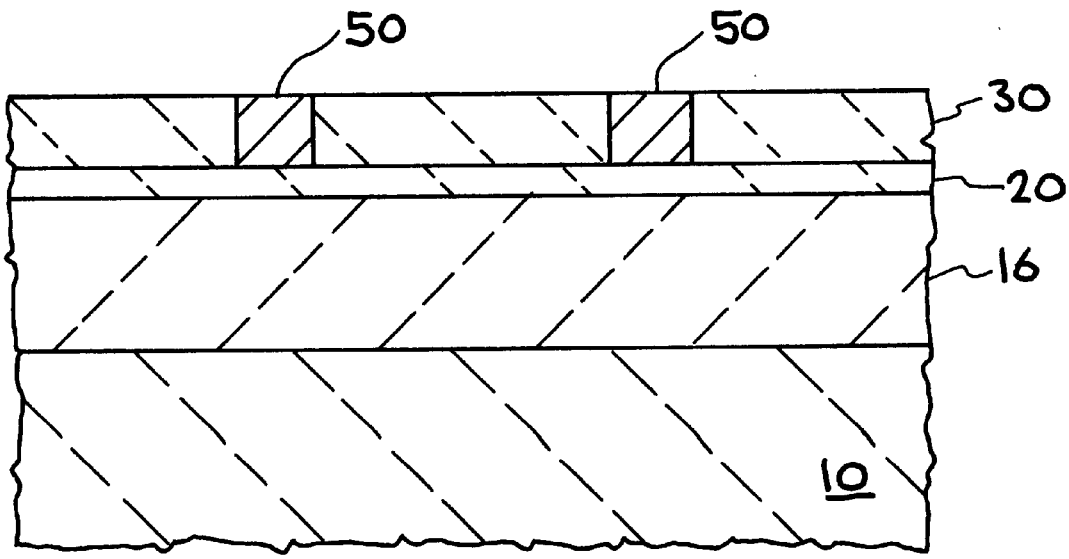
FIG. 14 is a fragmentary vertical side-section view of the final structure of FIG. 13 showing the trenches filled with metal to form the second metal wiring level.
Figure 16:
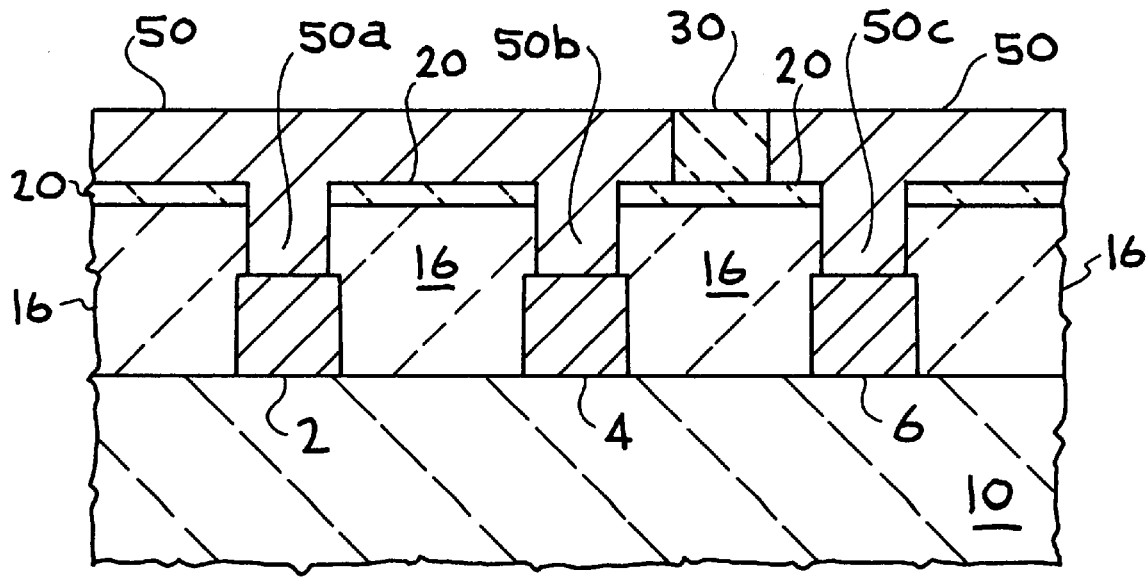
FIG. 16 is a fragmentary vertical side-section view of the final structure of FIG. 15 showing the trenches filled with metal to form the second metal wiring level and the filling of the vias with metal plugs to electrically connect the first metal wiring level with the second metal wiring level.

After the etching step and removal of second metal wiring etch mask 40, a metal layer is then deposited over etched second insulation layer 30 to fill the trenches etched therein, as well as to form metal plugs in the vias etched in first insulation layer 16 through the openings in via etch mask 20. Any portions of this metal layer deposited on the surface of second insulation layer 30 are then removed, leaving second metal wiring layer 50, as shown in FIGS. 12, 14, and 16, connected through the metal plugs 52, 54, 56, and 58 (FIGS. 12 and 16) in filled vias to underlying metal lines 2–8.

It should be noted that the metal used to form second metal wiring level 50, and to fill the vias etched in first insulation layer 16 with metal 52–58, should have a lower melting point than the underlying metal used to form metal lines 2, 4, 6, and 8 comprising the first metal wiring level, so that the filling of the vias and formation of the second metal wiring level will not disturb, e.g., melt, metal lines 2, 4, 6, and 8 comprising the first metal wiring level. This can be easily carried out, when using aluminum as the metal for both the first and second metal wiring levels, as well as for filling the vias, by alloying the aluminum with other metals such as copper, etc. and then varying the amount of alloying metal to appropriately alter the melting point of the resulting respective aluminum alloys. It should be further noted, in this regard, that in accordance with the invention, further metal wiring layers (third, fourth, etc) can also be formed with self aligned vias in the same manner as just described, and when such is done, each wiring level (and corresponding via fillings) should be carried out for each metal layer, using a lower melting metal than the previous layer.

Thus, the invention provides a structure and process wherein separate etch masks need not be used in separate etching steps to first form vias in an insulation layer (with a via mask and via etch), optionally independently fill the vias, and then to deposit a metal layer over the filled (or unfilled) vias followed by deposition of a metal wiring mask and then a metal etch through the metal wiring etch mask to form metal lines in registry with the underlying vias. Using the buried via mask of the invention, the vias are formed (etched) in the same etch step used to form the trenches in the overlying insulation layer so that the vias are self-aligned with the trenches. A single metal filling step then fills the vias and forms the overlying metal wiring.

It should also be noted that the structure and process of the invention could be used in connection with gate array technology wherein a generic buried via mask could be formed over a first insulation layer with openings therein to each and every underlying metal line.

The customizing of the integrated circuit structure could then be carried out without the need to create a custom via mask by providing a subsequent custom reverse metal wiring mask wherein no openings would be provided (and therefore no trenches formed) in the metal wiring mask over those openings in the buried via mask where no vias are desired (no connection desired to the underlying component or metal line). Subsequent etching through the reverse metal wiring mask to form the next wiring level would, therefore, simply not form the undesired vias in those regions, thereby enabling customization of the structure without the need to create and use a separate custom via mask.

Figure 17:
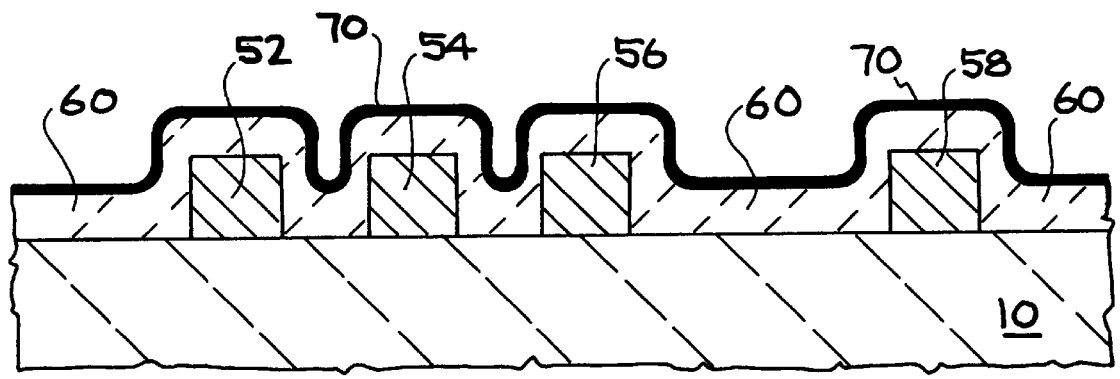
FIGS. 17–19 are sequential fragmentary vertical side-section views showing the construction of a via mask in accordance with a second embodiment of the invention.

Turning now to FIGS. 17–26, a second embodiment of the invention is illustrated. In this embodiment, metal lines 52, 54, 56, and 58 are shown formed over integrated circuit structure 10 in similar fashion to the first embodiment. However, unlike the earlier embodiment wherein planarized first insulation layer 16 was formed over metal lines 2–8, a conformal insulation layer 60, such as a layer of undoped silicon oxide, and preferably having a thickness ranging from 0.1 μm to about 0.5 μm, is formed over metal lines 52–58 and integrated circuit structure 10, as shown in FIG. 17. Over conformal insulation layer 60 is then formed a conformal via mask layer 70 which, as in the previous embodiment, preferably comprises silicon nitride, but which may be formed of any material capable of being deposited as a conformal layer and also being capable of use as the via mask layer of the first embodiment. Conformal mask layer 70 preferably has a thickness ranging from about 0.05 μm to about 0.5 μm.

Figure 18:
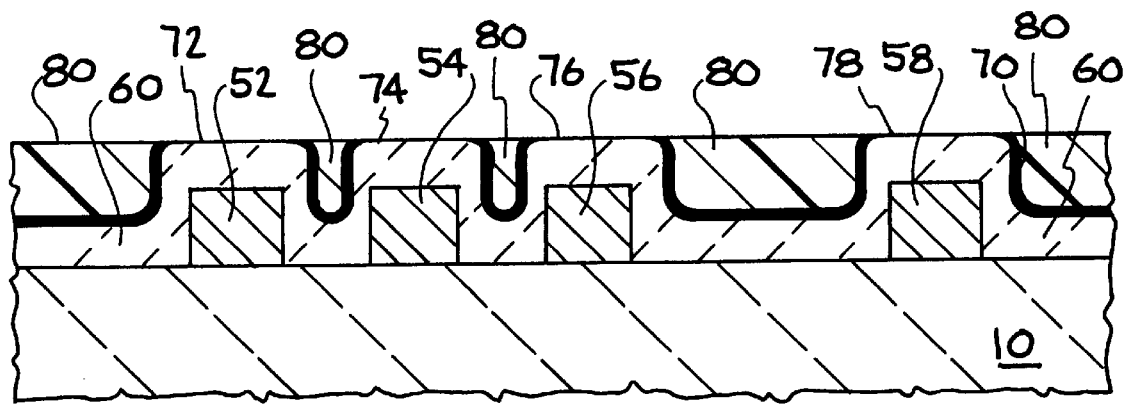
Figure 19:
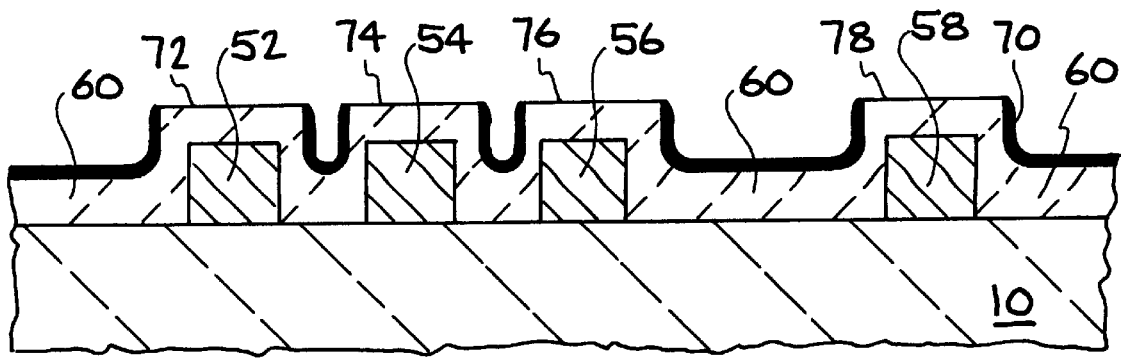
Figure 20:
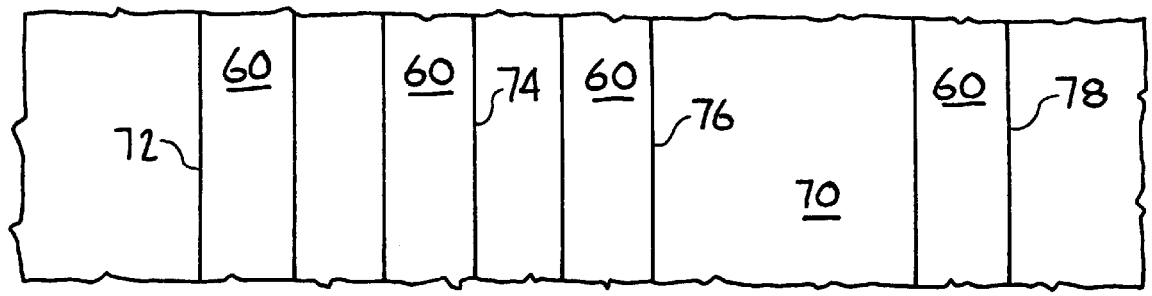
FIG. 20 is a fragmentary top view of the via mask structure shown in FIG. 19.

After formation of conformal via mask layer 70 over first insulation layer 60, the structure is subject to a planarization step, either by deposition of a planarizing layer such as a resist layer 80, followed by an anisotropic etch, as illustrated in FIG. 18, or by a chemical/mechanical polishing step to remove the raised portions of conformal via mask layer 70, i.e., to form openings in mask layer 70. If a planarizing resist layer is used, the remaining portions of the resist layer are then removed after the planarizing step. In either instance, the result is the structure shown in FIGS. 19 and 20, with mask openings 72, 74, 76, and 78 formed in via mask layer 70 over (and in registry with) metal lines 52–58. It will be noted that in this embodiment, mask openings 72–78, formed in the planarizing of mask layer 70, extend the full distance of the underlying metal lines due to the manner in which openings 72–78 are formed. That is, wherever there are no underlying metal lines, there will be no raised portions of the overlying conformal oxide and etch layer coatings and therefore no openings will be formed in mask layer 70 at those points during the planarizing step.

Figure 21:
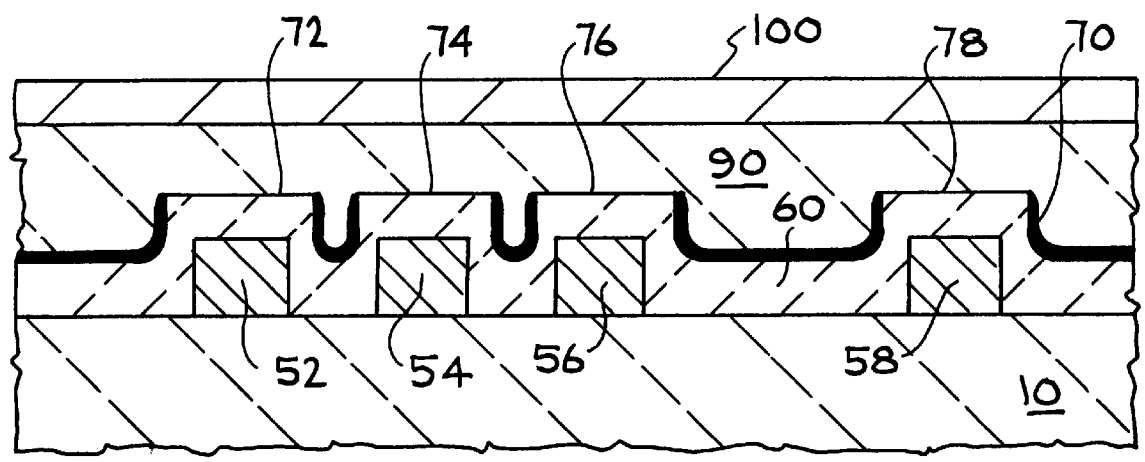
FIG. 21 is a fragmentary vertical side-section view of the structure of FIGS. 19 and 20 after formation of a second insulation layer over the via mask layer and a reverse second metal wiring etch mask formed over the second insulation layer.
Figure 22:
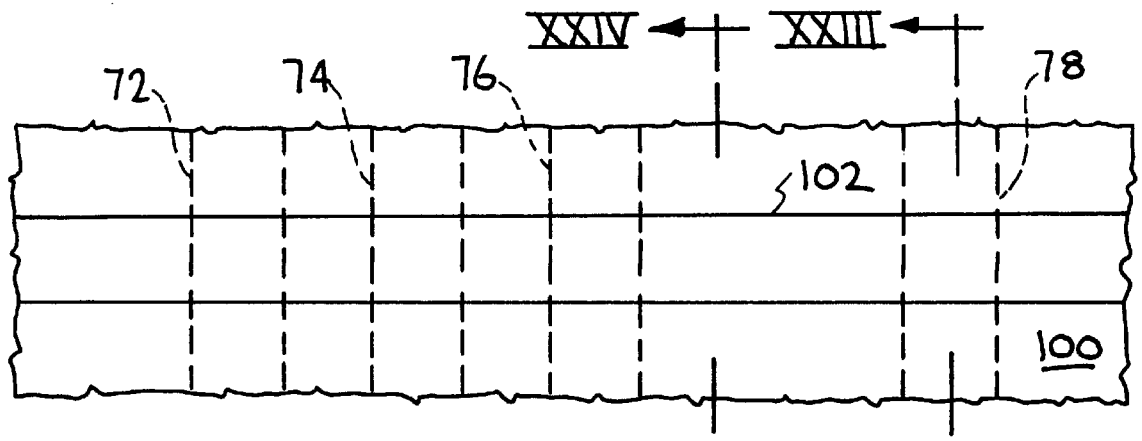
FIG. 22 is a fragmentary top view of the reverse second metal wiring level mask shown in FIG. 21 formed over the second insulation layer.
Figure 23:
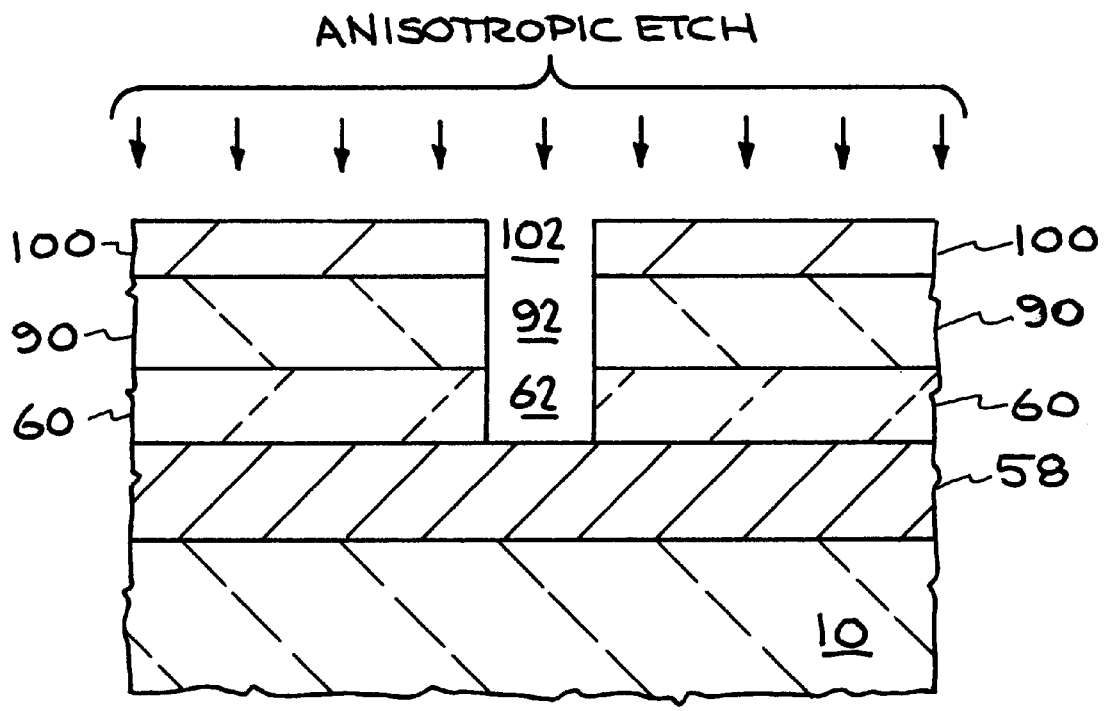
FIG. 23 is a fragmentary vertical side-section view of the structure of FIG. 22, taken along lines XXIII—XXIII showing, in dotted lines, the regions of the underlying insulation layers to be etched through the openings in the both the reverse second metal wiring level mask and the via mask down to the first level metal wiring.
Figure 24:
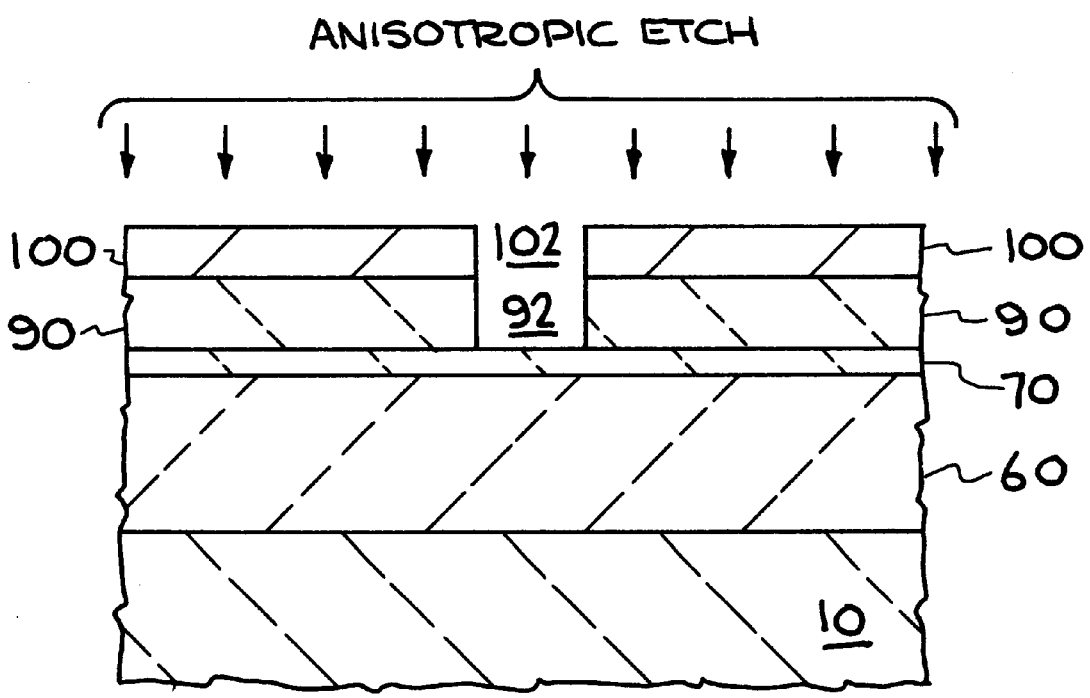
FIG. 24 is a fragmentary vertical side-section view of the structure of FIG. 22, taken along lines XXIV—XXIV showing, in dotted lines, the regions of the underlying insulation layer to be etched through the openings in the reverse second metal wiring level mask down to the via mask.

After patterning of via mask layer 70 to form openings 72–78 therein, a second insulation layer 90 is formed over via mask layer 70 and planarized, as shown in FIG. 21. The thickness of second insulation layer 90 over metal lines 52–58 preferably will range from about 0.2 μm to about 2.0 μm. Second insulation layer 90, like conformal first insulation layer 60, may also comprise silicon oxide, or at least an insulation material which will be responsive to the same etch system as conformal first insulation layer 60, so that both layers may be etched during the same etch step.

Figure 25:
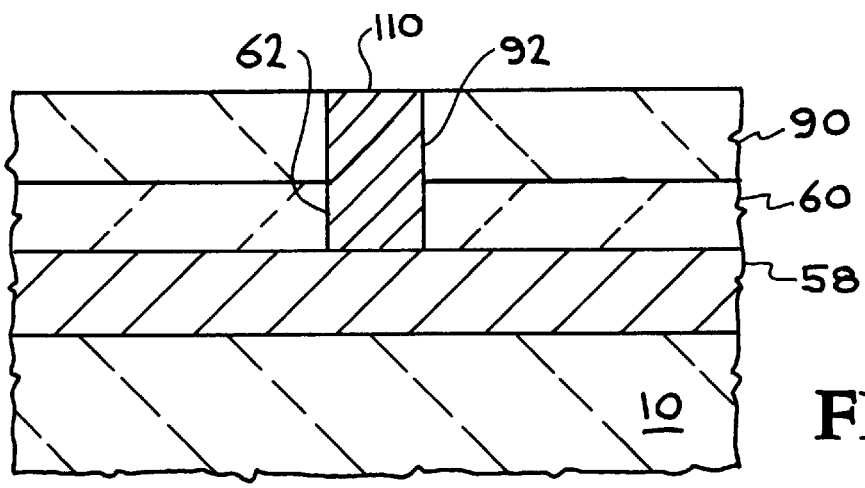
FIG. 25 is a fragmentary vertical side-section view of the structure of FIG. 23 after filling of the illustrated trench with metal to form the second metal wiring level and the filling of the underlying via with metal to electrically connect the first metal wiring level with the second metal wiring level.
Figure 26:
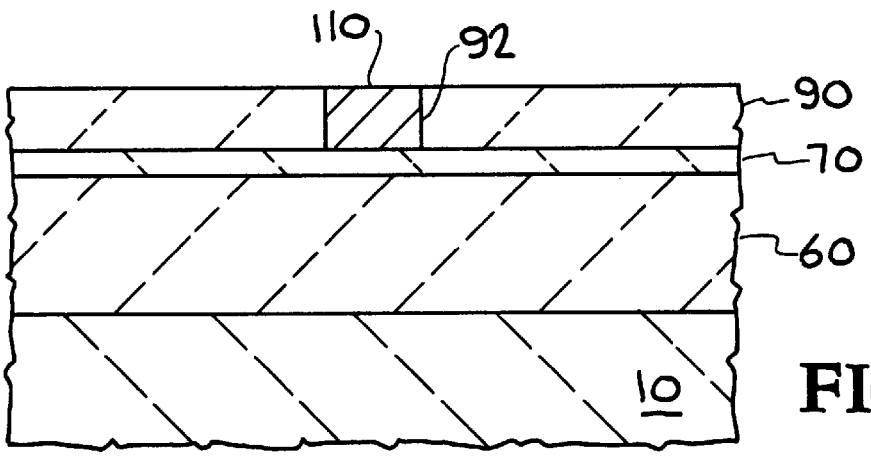
FIG. 26 is a fragmentary vertical side-section view of the structure of FIG. 24 after filling of the illustrated trench with metal to form the second metal wiring level.

A reverse second metal wiring layer etch mask 100, such as a photoresist mask, is then formed over planarized second insulation layer 90, as shown in FIGS. 21–24. It will be noted that the illustrated opening 102 in second metal wiring mask 100 (which is intended to be merely illustrative of a plurality of such mask openings) is formed orthogonal to underlying openings 72–78 in via etch mask 70 beneath second insulation layer 90. Trench 92 is then etched in second insulation layer 90 through opening 102 in second metal wiring mask 100, as shown in FIGS. 23–26, to provide for the formation of a second metal wiring layer therein. During this etching step, as in the earlier embodiment, portions of first conformal insulation layer 60 under openings 72–78 in via metal mask 70, which become exposed as overlying second insulation layer 90 is etched away, are also etched to form vias to underlying metal lines 52–58, as illustrated by via 62 in FIGS. 23 and 25. After removal of second metal wiring mask 100, subsequent deposition of metal layer 110 to fill trench 92 also results in the filling of the vias, such as illustrated by filled via 62 in FIG. 25, formed in conformal insulation layer 60 from trench 92 down to underlying metal lines 52–58. Removal of any portions of metal layer 110 which may deposit on the surface of second insulation layer 90 leaves a second metal wiring harness formed in the trenches such as illustrated trench 92 etched in second insulation layer 90, as shown in FIGS. 25 and 26, with the resulting metal plugs formed by filling the vias electrically connecting this second wiring harness with underlying metal lines 52–56, as shown in FIG. 25.

Turning now to FIGS. 27–31, yet a third embodiment is illustrated. In the previous embodiment illustrated in FIGS. 17–26, the via mask has the advantage of being self aligned to the underlying metal lines due to the manner in which the openings in the via mask are formed, i.e., by removing the raised portions of the conformal via mask layer over the raised metal lines. However, in that embodiment, the respective openings in the via mask extend the entire length of the underlying metal line. This could, in turn, create a problem if it is desired to cross one of the openings in the via mask with an orthogonal metal line in the next wiring level without making electrical contact (through the via mask and resulting via) with the underlying metal line being crossed in the previous metal wiring layer. This third embodiment addresses this problem.

Figure 27:
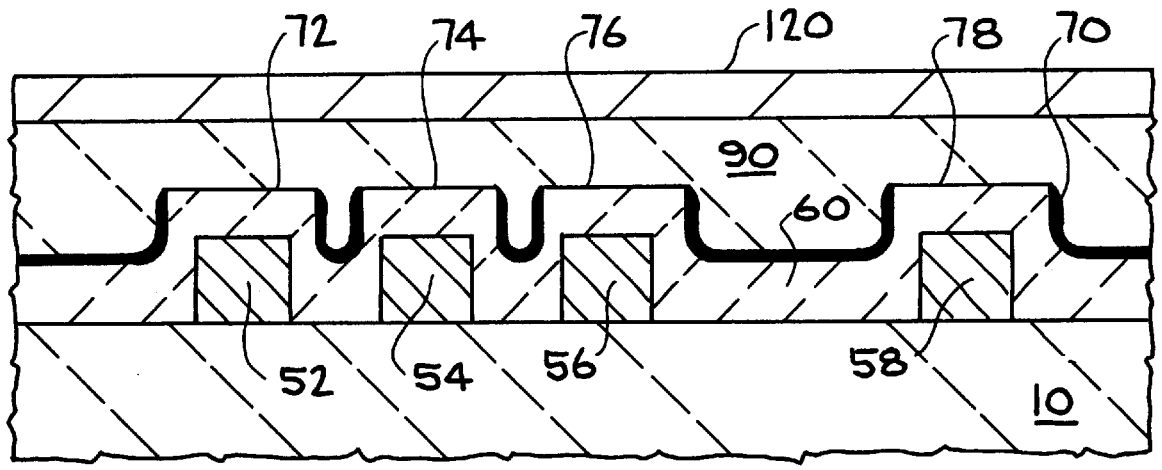
FIG. 27 is a fragmentary vertical side-section view of a structure similar to that shown in FIG. 19, but with a second insulating layer formed thereon and a second via mask formed over the second insulating layer in accordance with a third embodiment of the invention.
Figure 28:
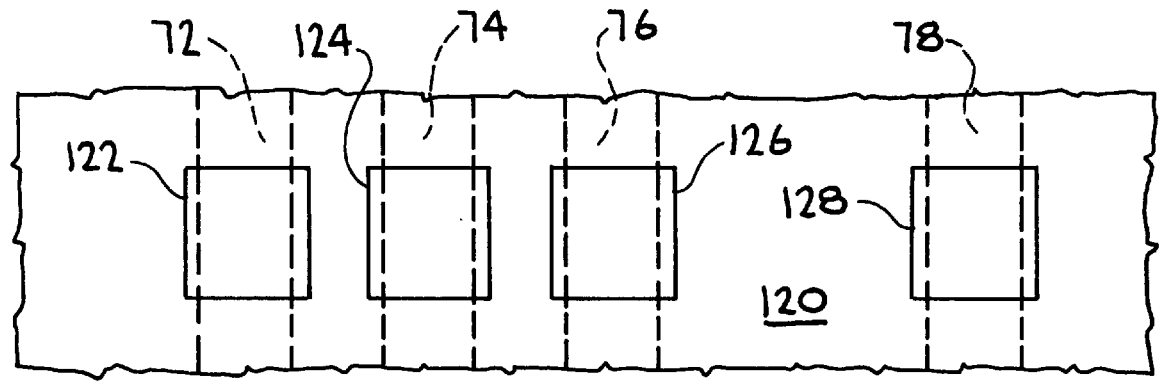
FIG. 28 is a top view of the structure of FIG. 27, showing the second via etch mask, with the underlying first via etch mask shown in dotted lines.

In FIG. 21 of the previous embodiment, a planarized second insulation layer 90 is shown formed over the conformal via etch layer 70, and reverse second metal wiring mask 100 is then formed over second insulation layer 90. In this embodiment, as shown in FIG. 27, after formation of planarized insulation layer 90 over conformal via etch mask layer 70, a second via etch mask 120 is then formed over second insulation layer 90. The thickness of second insulation layer 90 over metal lines 52–58, in this embodiment, preferably will range from about 0.2 μm to about 2.0 μm, just as in the second embodiment. Openings 122, 124, 126, and 128 are formed in second via etch mask layer 120 which, as shown in FIG. 28, may be rectangular in shape and formed in general registry with respective underlying openings 72–78. It will be noted, however, that the width of via mask openings 122-128 in second via etch mask 120 may exceed the width of openings 72–78 in first via etch mask 70, since openings 72–78, being self-aligned with the sides of underlying metal lines 52–58, will prevent the undesired formation of a via through openings 122–128 which would extend to the underlying integrated circuit structure 10 adjacent metal lines 52–58, rather than to the metal lines, i.e., the self-alignment prevents the via from missing the metal line.

Figure 29:
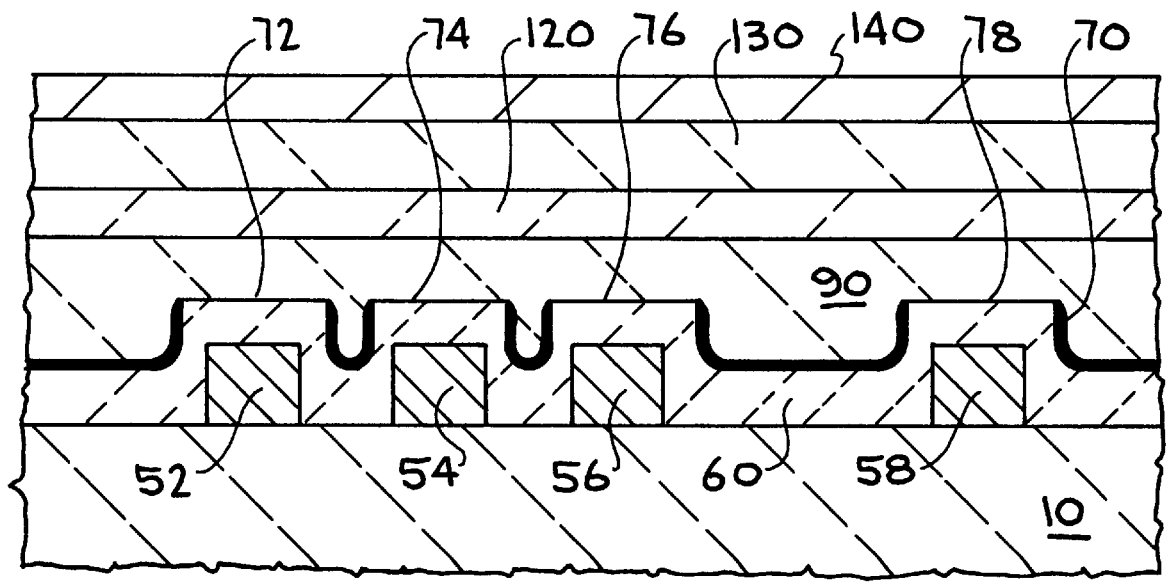
FIG. 29 is a fragmentary vertical side-section view of the structure of FIG. 27, showing a third insulating layer formed over the second via etch mask, and a reverse second metal wiring mask shown formed over the third insulating layer.
Figure 30:
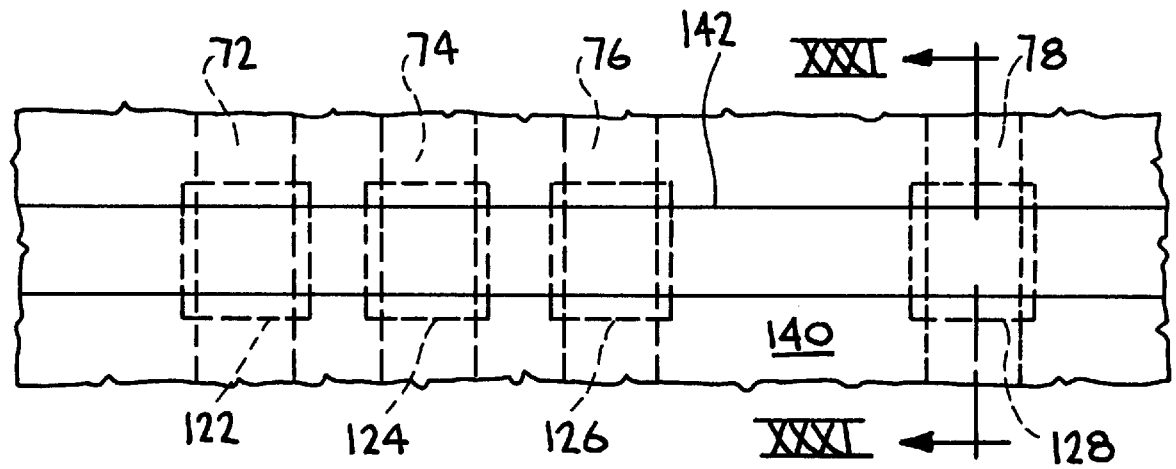
FIG. 30 is a top view showing the reverse second metal wiring mask of FIG. 29, with the underlying first and second via masks shown in dotted lines.
Figure 31:
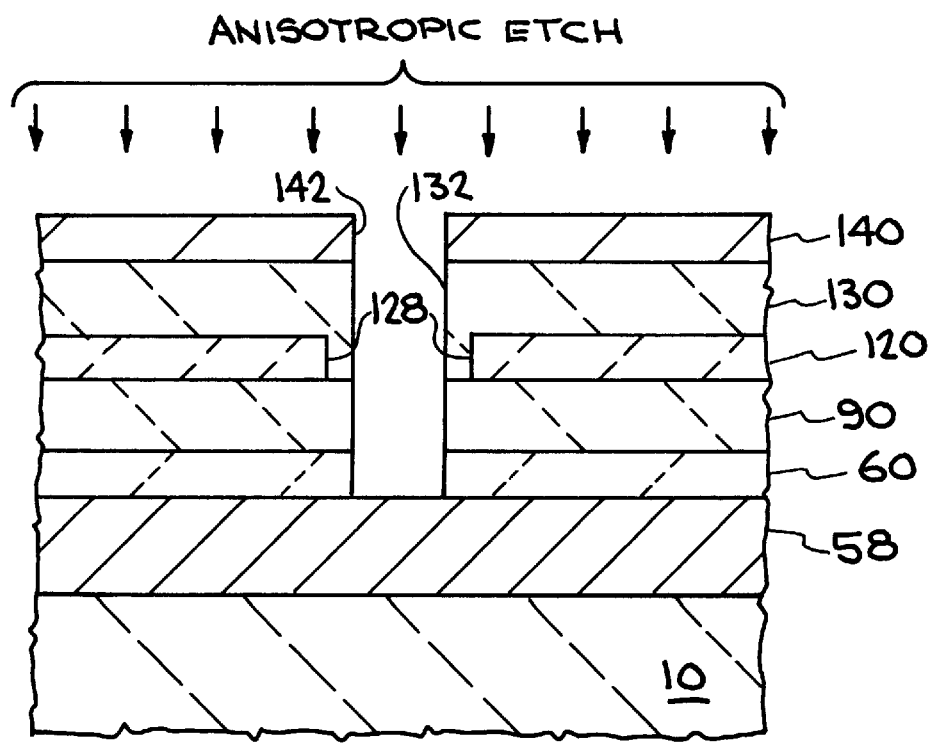
FIG. 31 is a fragmentary vertical side-section view of the structure of FIG. 30, taken along lines XXX—XXX, showing the anisotropic etching of the structure to form the second metal wiring level and to form a via through both via masks down to a metal line of the first metal wiring level.
Figure 32:
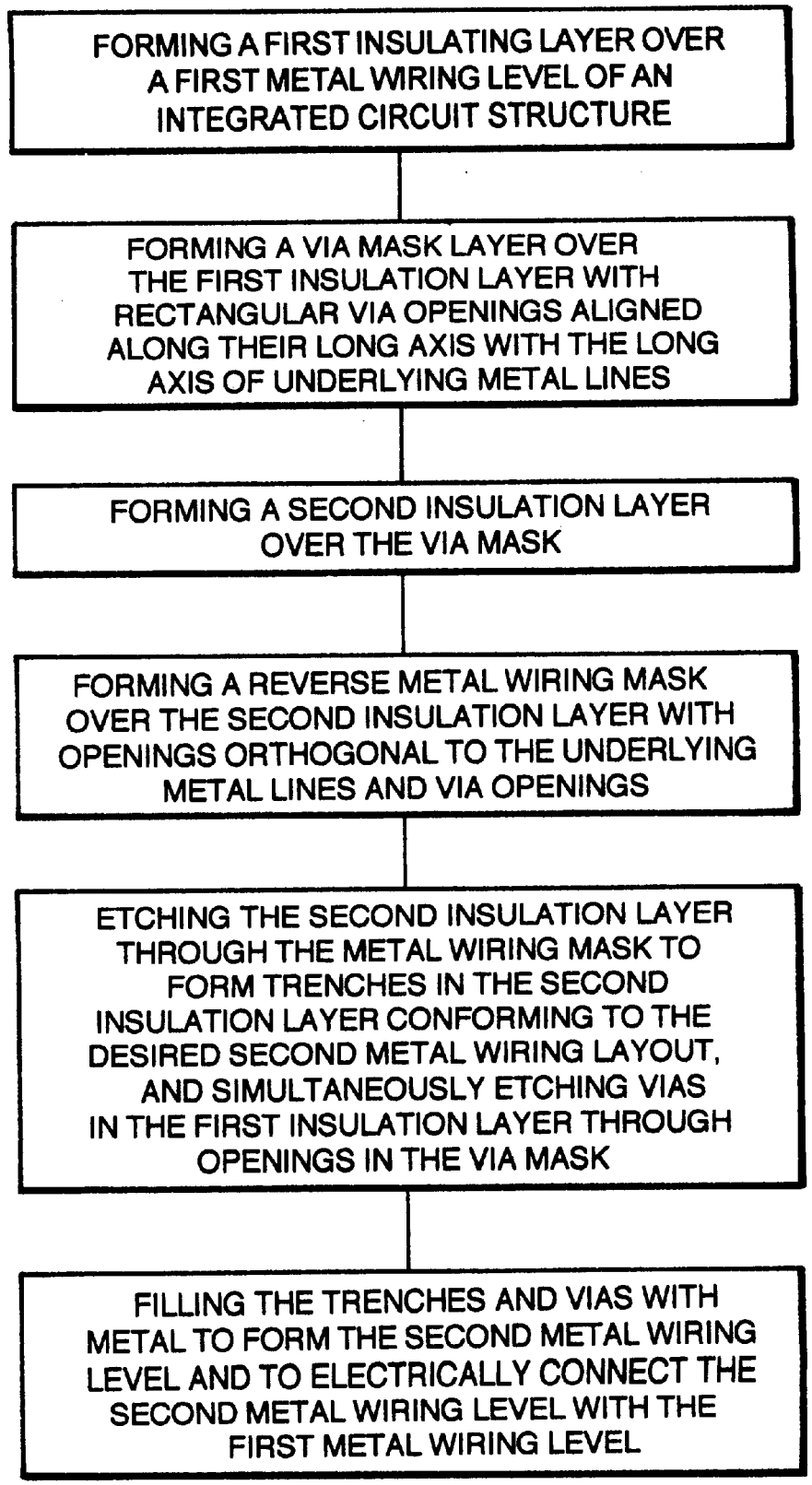
FIG. 32 is a flowsheet illustrating the process of the invention.

Following formation of second via etch mask 120, a third insulation layer 130 is formed over via etch mask 120, and reverse second metal wiring level mask 140 is then formed over third insulation layer 130, as shown in FIGS. 29 and 30. The thickness of third insulating layer 130 should preferably also be approximately equal to the thickness of the underlying metal lines, i.e., ranging from about 0.02 μm to about 0.2 μm. Openings, such as illustrated opening 142 in FIGS. 30 and 31, are formed in reverse second metal wiring mask 140 orthogonal to underlying first via mask openings 72–78 and crossing over openings 122–128 in second via mask 120, as best seen in FIG. 30. After formation of reverse second metal wiring mask 140, the structure is subject to an anisotropic etch to form trenches, such as illustrated trench 132 in third insulation layer 130, beneath openings in mask 140 and, at the same time, to form vias down to all or some of metal lines 52–58 (depending upon the via openings provided in second via etch mask 120). It will be noted, in this regard, that such vias will be self aligned in both the x and y directions, respectively due to the self-alignment of the openings in first via mask 70 with respect to the sides of metal lines 52–58, and the orthogonal sidewalls of the openings in second via mask 120. That is, the openings in first via mask 70 provide alignment for the vias along the x axis and the openings in second via mask 120 provide alignment along the y axis. Thus, gross misalignment of mask openings such as opening 142 in reverse second metal wiring mask, with respect to the underlying openings in via masks 70 and 120, will still result in formation of vias through insulation layers 60, 90, and 130 which will intersect the underlying metal lines, not integrated circuit structure 10.

Of course, it will be recognized that there must be some alignment of the respective mask openings in the three mask layers or else no via will be formed.

Thus, the invention comprises a process and structure wherein trenches for an upper metal wiring level, and vias connecting the respective metal wiring level with underlying metal lines comprising the lower metal wiring level, may be formed in a single etching step; and the filling of such trenches with metal to form the metal wiring level, and the filling of the vias with metal plugs to electrically interconnect the underlying metal wiring layer and the subsequent metal wiring level may also be carried out simultaneously in the same metal deposition step, with the underlying via etch mask or masks serving to provide for the formation of the vias in the underlying insulation layer or layers in registry with the trenches formed in an insulation layer overlying the via etch mask layer. By use of metals having varying melting points, subsequent metal wiring layers and metal filled vias may be formed, in accordance with the invention, with each subsequent metal wiring level and accompanying vias having a lower melting point than previous metal levels.

Having thus described the invention what is claimed is:

1. A process for forming a metal wiring level and metal plug-filled vias in an insulation layer thereunder, which metal plugs electrically interconnect said metal wiring level with an underlying metal wiring level thereunder which comprises:
    a) providing an integrated circuit structure having a first metal wiring level formed thereon;
    b) forming a first conformal insulation layer over said first metal wiring level;
    c) forming a conformal via etch mask layer over said first conformal insulation layer;
    d) planarizing said conformal via etch mask layer sufficiently to remove all of the raised portions of said conformal via etch mask layer over said first metal wiring level, to thereby form openings in said conformal via etch mask layer aligned with raised portions of said first metal wiring level below said first conformal insulation layer;
    e) forming a second insulation layer over said planarized conformal via etch mask layer;
    f) forming a reverse second level metal wiring mask over said second insulation layer, said reverse second level metal wiring mask having openings therein in registry with at least some of said openings in said via etch mask layer ;
    g) etching said second insulation layer through openings in said reverse second level metal wiring mask to form trenches in said second insulation layer, and simultaneously etching vias in said first conformal insulation layer through openings in said conformal via etch mask layer exposed by said etching of said second insulation layer; and
    h) filling said trenches etched in said second insulation layer and said vias etched in said first conformal insulation layer with metal to respectively form a second metal wiring level and said metal plugs electrically connecting said second metal wiring level with said first metal wiring level;

whereby said openings formed in said conformal via etch mask layer by said planarizing step will be self-aligned to said first metal wiring beneath said openings, and said steps of etching vias in said first conformal insulation layer through openings in said conformal via etch mask layer exposed by said etching of said second insulation layer and then filling said vias etched in said first conformal insulation layer with metal plugs to electrically connect said second metal wiring level with said first metal wiring level, will result in the formation of metal plugs aligned with said underlying first metal wiring.

2. The process of claim 1 wherein said first conformal insulation layer and said second insulation layer are formed of materials capable of being etched with the same etching system.

3. The process of claim 2 wherein said first conformal insulation layer and said second insulation layer are formed of an oxide of silicon.

4. The process of claim 3 wherein said via etch mask is formed from silicon nitride.

5. The process of claim 2 wherein said step of filling said trenches and said vias with said metal further comprises selecting a metal having a lower melting point than the metal used to form said first metal wiring level whereby said step of filling said trenches and vias with said metal to form said second metal wiring level and said metal plugs will not result in the melting of the metal used to form said first metal wiring level.

6. The process of claim 2 wherein said steps of filling said trenches with metal and filling said vias with metal are carried out simultaneously.

7. The process of claim 2 wherein said step of forming said first conformal insulation layer further comprises planarizing the upper surface of said first conformal insulation layer.

8. The process of claim 2 wherein said openings in said second level metal wiring mask are rectangular and have a long axis orthogonal to the long axis of underlying metal lines in said first metal wiring level.

9. The process of claim 2 wherein further metal wiring levels and interconnecting vias are formed over said structure by repeating steps b–g.

10. The process of claim 2 including the further steps of:
    a) forming a planarized insulation layer over said conformal via etch mask;
    b) forming a second via etch mask over said planarized insulation layer;
    c) forming a further insulation layer over said second via etch mask; and
    d) forming said reverse metal wiring mask over said further insulation layer.

11. The process of claim 2 including the further steps, after said step of forming said second insulation layer, of
    a) forming a second via etch mask over said second insulation layer, said second via etch mask having a pattern of mask openings formed therein; and
    b) forming a third insulation layer over said second via etch mask; and said step of forming a reverse second level metal wiring mask further comprises forming said reverse second level metal wiring mask over said third insulation layer.

12. A process for forming a second metal wiring level and metal plugs in vias formed in a silicon oxide insulation layer under said second metal wiring level, which metal plugs interconnect said second metal wiring level with a first metal wiring level under said silicon oxide insulation layer which comprises:

a) providing an integrated circuit structure having a one or more raised metal lines formed thereon;

b) forming a first conformal silicon oxide insulation layer over said one or more raised metal lines;

c) forming a conformal silicon nitride via etch mask layer over said first conformal silicon oxide insulation layer;

d) planarizing said conformal via etch mask layer sufficiently to remove all of the raised portions of said conformal via etch mask layer over said first metal wiring level, to thereby form openings in said conformal via etch mask layer aligned with raised portions of said first metal wiring level below said first conformal silicon oxide insulation layer;

e) forming a second silicon oxide insulation layer over said planarized conformal via etch mask layer;

f) forming a reverse second level metal wiring mask over said second silicon oxide insulation layer, said reverse second level metal wiring mask having openings therein in registry with at least some of said openings in said via etch mask layer;

g) etching said second silicon oxide insulation layer through said openings in said reverse second level metal wiring mask to form trenches in said second silicon oxide insulation layer, and etching vias in said first conformal silicon oxide insulation layer through said openings in said conformal via etch mask layer exposed by said etching of said second silicon oxide insulation layer; and h) filling said trenches etched in said second silicon oxide insulation layer and said vias etched in said first conformal silicon oxide insulation layer with metal having a lower melting point than said underlying one or more metal lines, to respectively form said second metal wiring level and said metal plugs electrically connecting said second metal wiring level with said first metal wiring level;

whereby said openings formed in said conformal silicon nitride via etch mask layer by said planarizing step will be self-aligned to said first metal wiring beneath said openings, and said steps of etching vias in said first conformal silicon oxide insulation layer through openings in said conformal via etch mask layer exposed by said etching of said second silicon oxide insulation layer and then filling said vias etched in said first conformal silicon oxide insulation layer with metal plugs to electrically connect said second metal wiring level with said first metal wiring level, will result in the formation of metal plugs aligned with said underlying first metal wiring.

13. A process for forming a metal wiring level and metal plug-filled vias in insulation layers thereunder, which metal plugs electrically interconnect said metal wiring level with an underlying metal wiring level thereunder which comprises:

a) providing an integrated circuit structure having a first metal wiring level formed thereon;

b) forming a first conformal insulation layer over said first metal wiring level;

c) forming a conformal via etch mask layer over said first conformal insulation layer;

d) planarizing said conformal via etch mask layer sufficiently to remove all of the raised portions of said conformal via etch mask layer over said first metal wiring level, to thereby form openings in said conformal via etch mask layer aligned with raised portions of said first metal wiring level below said first conformal insulation layer;

e) forming a second insulation layer over said planarized conformal via etch mask layer;

f) forming a second via etch mask having a pattern of mask openings over said second insulation layer;

g) forming a third insulation layer over said second via etch mask;

h) forming a reverse second level metal wiring mask over said third insulation layer, said reverse second level metal wiring mask having openings therein in registry with at least some of said openings in said second via etch mask;

i) etching said third insulation layer through said openings in said reverse second level metal wiring mask to form trenches in said third insulation layer, and then etching vias in said first conformal insulation layer and said second insulation layer respectively through openings in said second via etch mask and said conformal via etch mask layer respectively exposed by said formation of said trenches in said third insulation layer and said formation of vias in said second insulation layer; and j) filling said trenches etched in said third insulation layer and said vias etched in said first conformal insulation layer and said second insulation layer with metal to respectively form a second metal wiring level and said metal plugs electrically connecting said second metal wiring level with said first metal wiring level;

whereby said openings formed in said conformal via etch mask layer by said planarizing step will be self-aligned to said first metal wiring beneath said openings, and said steps of etching vias in said first conformal insulation layer through openings in said conformal via etch mask layer exposed by said etching of said vias in said second insulation layer and then filling said vias etched in said first conformal insulation layer and said second insulation layer with metal plugs to electrically connect said second metal wiring level with said first metal wiring level, will result in the formation of metal plugs aligned with said underlying first metal wiring.

* * * * *